United States Patent [19]

Madni et al.

[11] Patent Number: 5,684,433

[45] Date of Patent: Nov. 4, 1997

[54] DUAL-FEEDBACK AMPLIFIER CIRCUIT ARRANGEMENTS

[75] Inventors: Arshad Madni, Swindon; Nicholas Paul Cowley, Wroughton; Ian Garth Watson, Swindon, all of United Kingdom

[73] Assignee: Plessey Semiconductors Limited, United Kingdom

[21] Appl. No.: 566,859

[22] Filed: Dec. 4, 1995

[30] Foreign Application Priority Data

Dec. 9, 1994 [GB] United Kingdom ............ 9424878

[51] Int. Cl.$^6$ .................. H03F 3/45; H03F 1/34
[52] U.S. Cl. ................ 330/260; 330/85; 330/104
[58] Field of Search ............ 330/69, 85, 104, 330/156, 252, 260

[56] References Cited

U.S. PATENT DOCUMENTS 3,688,209  8/1972  TeWinkel .
3,769,605  10/1973  Long .
4,739,282  4/1988  Scheinberg .
4,904,952  2/1990  Tanimoto ................ 330/252

FOREIGN PATENT DOCUMENTS

A 1 536 982   4/1971   France .
A-2 694 850   2/1994   France .
163907       12/1980   Japan ................ 330/85
2230155      10/1990   United Kingdom ..... 330/252

OTHER PUBLICATIONS

Patent Abstracts of Japan, Vo. 12, No. 94 (E-593), Mar. 26, 1988.

Primary Examiner—James B. Mullins
Attorney, Agent, or Firm—Kirschstein, et al.

[57] ABSTRACT

In an amplifier circuit arrangement in which series resistive feedback is utilized in the main amplifier to minimize distortion, and a feedback amplifier is provided in a path from the output of the arrangement to the series feedback path effectively to boost the value of the feedback resistor, a further amplifier is arranged to provide positive feedback to the resistive load circuit of the main amplifier effectively to boost the value of the resistive load.

5 Claims, 2 Drawing Sheets

1

DUAL-FEEDBACK AMPLIFIER CIRCUIT ARRANGEMENTS

BACKGROUND OF THE INVENTION

The present invention relates to amplifier circuit arrangements, and in particular to such arrangements utilizing feedback to achieve low noise, low distortion and, preferably, controlled input impedance. The circuit arrangement may also be required to operate within the constraints of a low supply voltage of, say, 5 volts and an all-npn junction transistor structure.

In prior arrangements, where the dynamic range or linearity of an amplifier is unsatisfactory series feedback may be provided in the input circuit. While reducing the distortion, this series feedback has the effect of reducing the gain of the amplifier and potentially degrading its noise performance. In a transconductance amplifier, for example, having a transconductance of gm, a series feedback resistor of value Re would lower the effective transconductance to gm/(1+gm. Re).

SUMMARY OF THE INVENTION

According to one aspect of the present invention in an amplifier circuit arrangement comprising a transconductance amplifier providing output current signals to resistive load means, there is provided a further transconductance amplifier responsive to output voltage signals developed across said resistive load means to provide positive feedback current signals to said resistive load means.

According to another aspect of the present invention in an amplifier circuit arrangement including a fast transconductance amplifier incorporating series negative feedback means, said first amplifier providing output current signals to resistive load means, and second transconductance amplifier means responsive to signal voltages developed across said resistive load means to provide negative current feedback signals to said series negative feedback means, there is provided a third transconductance amplifier responsive to said signal voltages developed across said resistive load means to provide positive feedback current signals to said resistive load means.

BRIEF DESCRIPTION OF THE DRAWINGS

The first, second and third amplifiers may be differential amplifiers.

An amplifier circuit arrangement in accordance with the present arrangement will now be described by way of example with reference to the accompanying drawings, of which.

DETAILED DESCRIPTION OF THE PREFERRED EMBODIMENTS

Figure 1:
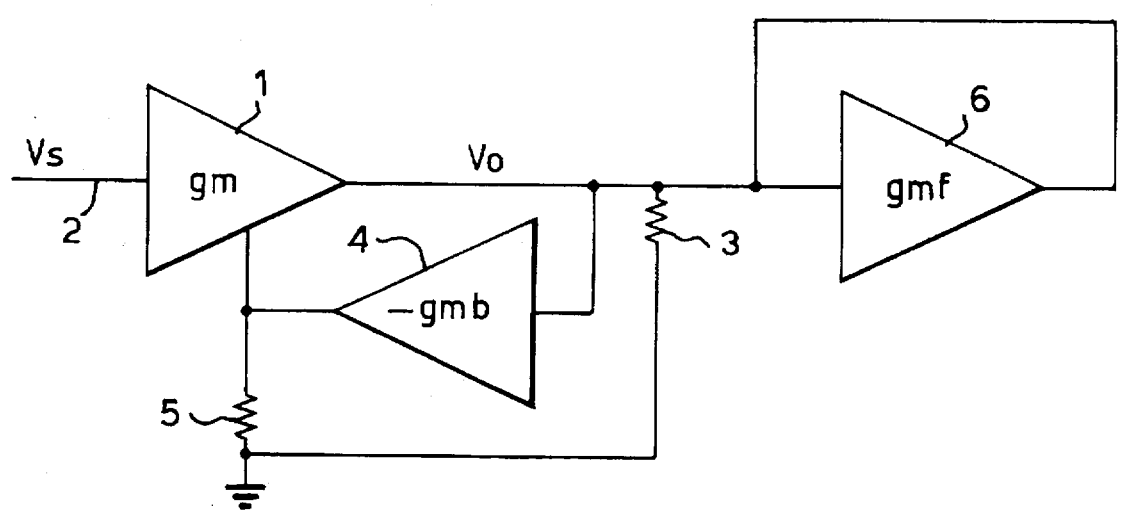
FIG. 1 shows the amplifier circuit arrangement schematically.

Referring first to FIG. 1, the amplifier circuit arrangement comprises a main amplifier 1 having a transconductance gm which in response to an input signal voltage Vs at an input 2 develops an output signal voltage Vo across a load resistor 3 having a value Rl. This output signal voltage Vo is applied to the input of a feedback amplifier 4 having a transconductance of −gmb the output current of which is applied to a negative feedback circuit including a series feedback resistor 5 having a value Rf. The effect of the feedback by way of the amplifier 4 is to boost the effective value Rf' of the feedback resistor 5 to Rf'=Rf(1+gmb.Rl), the voltage gain of the amplifier arrangement as so far described being:

$$\frac{Vo}{Vs} = \frac{gm.Rl}{(1+gm.Rf')}$$

The output voltage signal Vo is also applied to the input of a further amplifier 6 having a transconductance of gmf the output current of which is applied as a positive feedback signal to the load resistor 3. The effect of this positive feedback is to boost the effective value Rl' of the load resistor 3 to Rl'=Rl/(1−gmf.Rl), so that the overall voltage gain of the amplifier arrangement shown in FIG. 1 is:

$$\frac{Vo}{Vs} = \frac{gm.Rl'}{(1+gm.Rf')}$$

where Rl'=Rl/(1−gmf.Rl) and Rf'=Rf(1+gmb.Rl)

Figure 2:
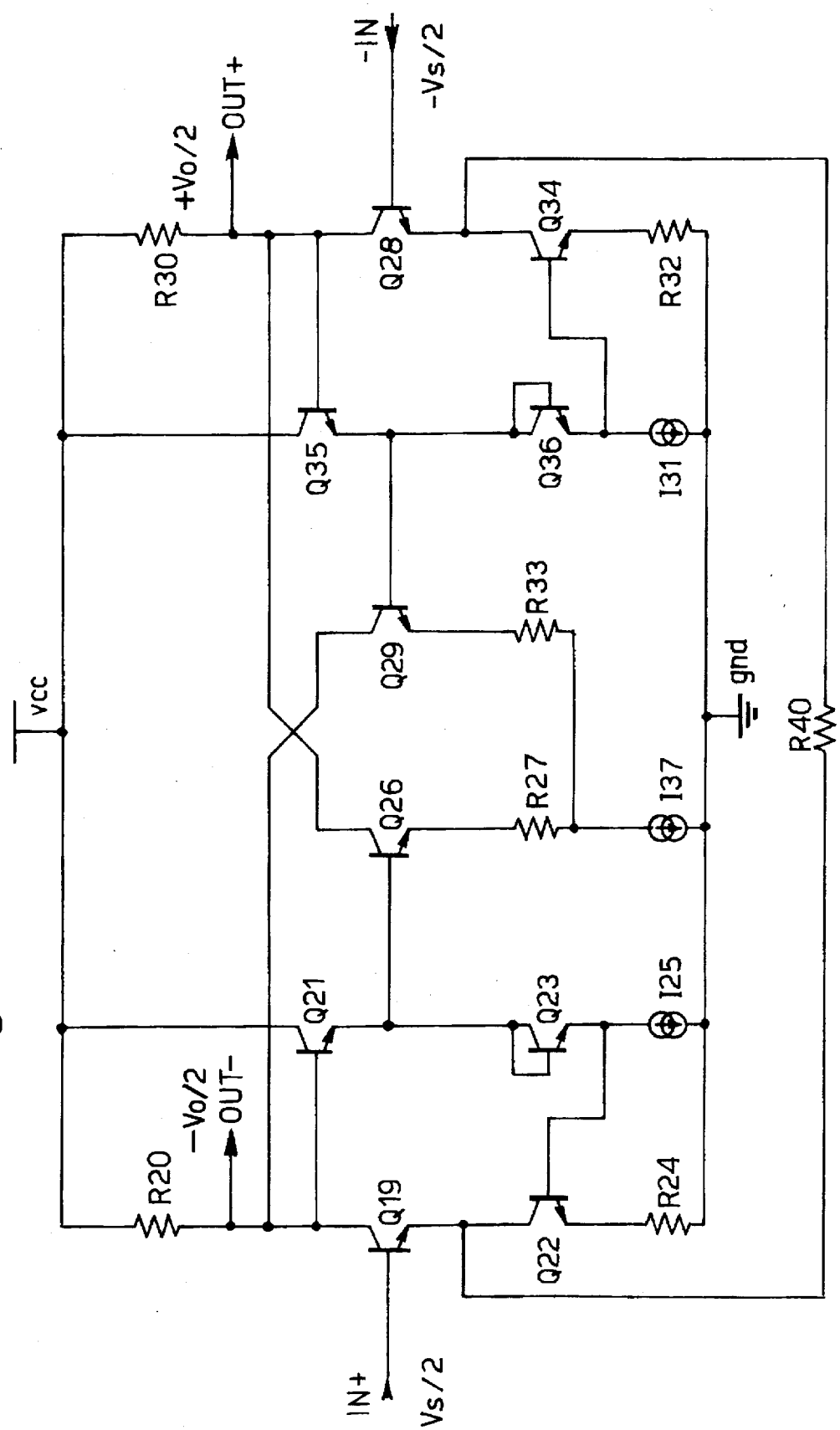
FIG. 2 shows the arrangement of FIG. 1 diagrammatically.

Referring now to FIG. 2, a differential input/differential output realization of the amplifier circuit arrangement of FIG. 1 comprises a pair of npn junction transistors Q19 and Q28 which have their base electrodes connected to the inputs of the arrangement and their emitter electrodes interconnected by way of a resistor R40 which effectively forms a series feedback resistor.

The differential output signal voltages of the amplifier arrangement which are developed across load resistors R20 and R30 are applied by way of respective emitter follower transistors Q21 and Q35 and diode-connected transistors Q23 and Q36 to the base electrodes of respective transistors Q22 and Q34, and also to the base electrodes respectively of transistors Q26 and Q29. The circuits Q22, Q23, I25 and R24, and Q34, Q36, I31 and R32, form the negative feedback amplifier 4 of FIG. 1, while the transistors Q26, Q29 and the associated resistors R27, R33 and the current source I37 form the positive feedback amplifier 6.

Since the transistors Q26 and Q29 effectively invert the signals passed on by the respective emitter followers Q21 and Q35, the collector electrodes of the transistors Q26 and Q29 are cross-connected, to the load resistors R30 and R20 respectively, to effect the required positive feedback.

The input impedance of the amplifier circuit arrangement can be set to a required value by selecting values for voltage feedback resistors (not shown) connected between the emitter electrode of transistor Q21 and the base electrode of transistor Q19 and between the emitter electrode of transistor Q35 and the base electrode of transistor Q28, respectively, in terms of the values of the other resistors in the circuit arrangement.

We claim:

1. An amplifier circuit arrangement, comprising: an amplifier having first and second inputs, first and second voltage supply lines, and an output; resistive load means connected between the output of said amplifier and the first voltage supply line for said amplifier; means for applying input signal voltages to the first input of said amplifier; series negative feedback means connected between the second input of said amplifier and the second voltage supply line for said amplifier; and means responsive to signal voltages developed across said resistive load means for providing negative feedback signals to said series negative feedback means and positive feedback current signals to said resistive load means.

2. An amplifier circuit arrangement, comprising: first and second amplifiers each having first and second inputs and an output; first and second resistive load means connected respectively between the outputs of said first and second amplifiers and a first voltage supply line for said amplifiers; means for applying input signal voltages differentially between the respective first inputs of said first and second amplifiers; first and second series negative feedback means connected respectively between the second inputs of said first and second amplifiers and a second voltage supply line for said amplifiers; and means responsive to signal voltages developed across said resistive load means to provide negative feedback signals to said series negative feedback means and positive feedback current signals to said resistive load means.

3. The amplifier circuit arrangement in accordance with claim 2, wherein said means responsive to signal voltages developed across said resistive load means comprises a differential transconductance amplifier having respective outputs which are connected to provide said positive feedback current signals to said first and second resistive load means.

4. The amplifier circuit arrangement in accordance with claim 2, wherein said first and second series negative feedback means comprise first and second transistors each having a main current path connected between the second input of said first and second amplifiers respectively and said second voltage supply line.

5. The amplifier circuit arrangement in accordance with claim 4, wherein said means responsive to signal voltages developed across said resistive load means provides negative feedback signals to respective control electrodes of said first and second transistors.

* * * * *